(12) United States Patent
Gipson et al.

(10) Patent No.: US 10,656,317 B2
(45) Date of Patent: May 19, 2020

(54) LAMINATED PRINTED CIRCUIT BOARD WITH OVER-MOLDED LIGHT GUIDE

(71) Applicant: Dura Operating, LLC, Auburn Hills, MI (US)

(72) Inventors: Ron G. Gipson, Metamora, MI (US); Bhanumurthy Veeragandham, Auburn Hills, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 52 days.

(21) Appl. No.: 15/852,433

(22) Filed: Dec. 22, 2017

(65) Prior Publication Data

US 2019/0196085 A1 Jun. 27, 2019

(51) Int. Cl.

| F21V 8/00 | (2006.01) |
|---|---|
| H05K 1/03 | (2006.01) |
| H05K 3/28 | (2006.01) |
| G02F 1/13357 | (2006.01) |
| G06F 3/041 | (2006.01) |

(52) U.S. Cl.
CPC ........... *G02B 6/0021* (2013.01); *G02B 6/006* (2013.01); *G02B 6/0031* (2013.01); *G02B 6/0055* (2013.01); *G02B 6/0065* (2013.01); *G02B 6/0091* (2013.01); *G02F 1/133605* (2013.01); *H05K 1/0353* (2013.01); *H05K 3/28* (2013.01); *G02B 6/0025* (2013.01); *G02B 6/0073* (2013.01); *G06F 3/041* (2013.01)

(58) Field of Classification Search
CPC .. G02B 6/0021; G02B 6/0091; G02B 6/0031; G02B 6/0065; H05K 1/0306; H05K 3/282
See application file for complete search history.

(56) References Cited

U.S. PATENT DOCUMENTS

| 7,924,654 B1 * | 4/2011 | Stottlemyer | .......... G01S 3/8083 367/119 |
|---|---|---|---|
| 9,869,810 B2 | 1/2018 | Keranen et al. | |

(Continued)

FOREIGN PATENT DOCUMENTS

| WO | 2017077193 A1 | 5/2017 |
|---|---|---|
| WO | 2017178701 A1 | 10/2017 |

(Continued)

OTHER PUBLICATIONS

US 9,915,556 B2, 03/2018, Keränen et al. (withdrawn)

*Primary Examiner* — Karabi Guharay
(74) *Attorney, Agent, or Firm* — Vivacqua Crane, PLLC

(57) ABSTRACT

A laminated printed circuit board with over-molded light guide includes a printed circuit board having electronic components mounted on a first face of the printed circuit board, and a bore extending through the printed circuit board. A light emitting diode is mounted on the first face proximate to the bore. An opaque film is fixed onto a second face of the printed circuit board, the opaque film creating an end wall of the bore. A light transmissive polymeric material is applied over each of the electronic components, the light emitting diode and a portion of the first face of the printed circuit board. A portion of the polymeric material extends into the bore and contacts the opaque film defining the end wall of the bore to create a light guide for transmitting light from the light emitting diode through the bore.

21 Claims, 4 Drawing Sheets

(56) References Cited

U.S. PATENT DOCUMENTS

| | | | |
|---|---|---|---|
| 2013/0270418 A1* | 10/2013 | Cho | ........................ G02F 1/015 250/206.1 |
| 2015/0308639 A1 | 10/2015 | Keranen et al. | |
| 2016/0295702 A1 | 10/2016 | Heikkinen et al. | |
| 2016/0345437 A1 | 11/2016 | Heikkinen et al. | |

FOREIGN PATENT DOCUMENTS

| WO | 2017178702 A1 | 10/2017 |
|---|---|---|
| WO | 2017178703 A1 | 10/2017 |

* cited by examiner

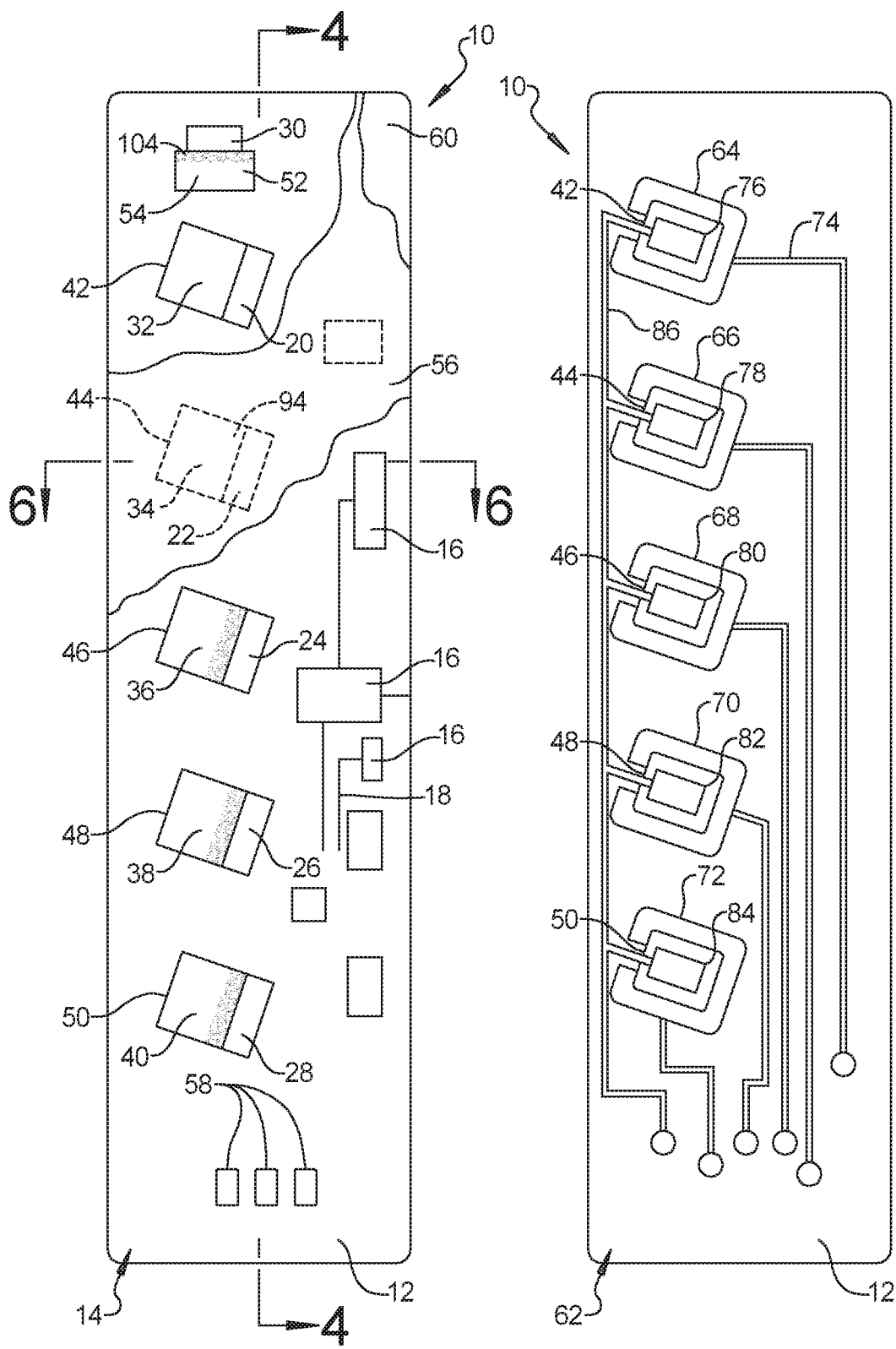

LAMINATED PRINTED CIRCUIT BOARD WITH OVER-MOLDED LIGHT GUIDE

FIELD

The present disclosure relates generally to fabricated printed circuit board parts with electronic components and particularly backlit components embedded in a molded plastic.

BACKGROUND

The statements in this section merely provide background information related to the present disclosure and may or may not constitute prior art.

Electronic assemblies with backlit visual elements may be manufactured via several processes. Most commonly, a plastic part is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding or any optically clear thermoplastic resin molding or a combination of low pressure molding and thermoplastic molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, insert the formed film into an injection mold having substantially the same shape, and then injection-mold plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronic components may also be printed onto a film. The film is then inserted into an injection mold, where plastic is molded onto the film, the electronic components being embedded in the molded plastic so that when the plastic part is removed from the mold the film is peeled away from the plastic part, leaving the electronic components embedded in or adhered to the surface of the plastic part.

While current printed circuit board parts with electronic components including backlit components are satisfactory, this field can benefit from the improved laminated printed circuit board with over-molded light guide of the present disclosure.

SUMMARY

According to several aspects, a laminated printed circuit board with over-molded light guide includes a printed circuit board having electronic components mounted on a first face of the printed circuit board, and a bore extending through the printed circuit board. A light emitting diode is mounted on the first face proximate to the bore. A light transmissive polymeric material is applied onto each of the electronic components, the light emitting diode and a portion of the first face of the printed circuit board. A portion of the polymeric material extends into the bore to create a light guide proximate to the light emitting diode.

In another aspect of the present disclosure, the light guide includes a texturally modified area defining a light modifier.

In another aspect of the present disclosure, the light modifier is a reflector positioned proximate to the light emitting diode.

In another aspect of the present disclosure, the light reflector is aligned with an axis of the bore.

In another aspect of the present disclosure, the light modifier is a diffuser formed at the end of the light guide within the bore.

In another aspect of the present disclosure, an opaque film is applied over a second face of the printed circuit board.

In another aspect of the present disclosure, the opaque film defines an end wall of the bore contacted by the portion of the polymeric material extending into the bore.

In another aspect of the present disclosure, light generated by the light emitting diode is blocked from passing through the opaque film except at a location of an indicia, the indicia defining light transparent portions of the opaque film.

In another aspect of the present disclosure, a touch capacitive circuit printed onto a second face of the printed circuit board.

In another aspect of the present disclosure, a white or reflector film is individually applied or ink printed over the light transmissive polymeric material.

In another aspect of the present disclosure, an opaque layer is disposed about a perimeter of the printed circuit board and the opaque film. An acrylic layer is disposed over an outer surface of the opaque film positioned opposite the surface applied over the first face of the printed circuit board, and the acrylic layer is disposed over a portion of the opaque layer.

According to several aspects, a laminated printed circuit board with over-molded light guide includes a printed circuit board having electronic components mounted on a first face of the printed circuit board, and a bore extending through the printed circuit board. A light emitting diode is mounted on the first face proximate to the bore. An opaque film is fixed onto a second face of the printed circuit board before or after molding the light guide, the opaque film creating an end wall of the bore. A light transmissive polymeric material is applied over each of the electronic components, the light emitting diode and a portion of the first face of the printed circuit board. A portion of the polymeric material extends into the bore and contacts the opaque film defining the end wall of the bore to create a light guide for transmitting light from the light emitting diode through the bore.

In another aspect of the present disclosure, a touch capacitive circuit is printed onto the second face of the printed circuit board and positioned between the opaque film and the second face. A touch capacitive sensor is connected to the second face of the printed circuit board and positioned between the opaque film and the second face.

In another aspect of the present disclosure, a white film is individually applied or ink printed onto a surface of the light transmissive polymeric material directed away from the light guide.

In another aspect of the present disclosure, an opaque layer is positioned about a perimeter of the printed circuit board and the opaque film.

In another aspect of the present disclosure, an acrylic layer is disposed over an outer surface of the opaque film positioned opposite the surface applied over the first face of the printed circuit board, and the acrylic layer is disposed over a portion of the opaque layer.

In another aspect of the present disclosure, the light guide includes a texturally modified area defining a light modifier, and wherein the light modifier is aligned with an axis of the bore.

In another aspect of the present disclosure, the light modifier is a diffuser formed at the end of the light guide within the bore.

According to several aspects, a laminated printed circuit board with over-molded light guide includes a printed circuit board of a metal material having electronic components mounted on a first face of the printed circuit board connected to first electrical traces printed on the first face, and a bore extending through the printed circuit board. A light emitting diode is mounted on the first face proximate to the bore and connected to the first electrical traces. A light transmissive polymeric material is overmolded onto the electronic components, the light emitting diode and at least a portion of the first face of the printed circuit board. A portion of the light transmissive polymeric material extends into the bore and contacts an opaque film having a translucent portion therein. The opaque film defines an end wall of the bore to create a light guide from the portion of the light transmissive polymeric material for transmitting light from the emitting diode through the bore and to the translucent portion of the opaque film. A polymeric material opaque layer positioned about a perimeter of the printed circuit board and a perimeter of the opaque film, and applied onto a surface of the light transmissive polymeric material extending freely beyond the opaque film.

In another aspect of the present disclosure, a touch capacitive circuit and a touch capacitive sensor are mounted on a second face of the printed circuit board. The opaque film is further applied over the second face of the printed circuit board including over the touch capacitive circuit and the touch capacitive sensor.

In another aspect of the present disclosure, the opaque film creates an end wall of the bore contacted by the light transmissive polymeric material extending into the bore. A face of the opaque layer is substantially co-planar with a face of the opaque film.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 1 is a top plan view of a first face of a laminated printed circuit board with over-molded light guide according to an exemplary embodiment;

FIG. 2 is a bottom plan view of a second face of the laminated printed circuit board with over-molded light guide of FIG. 1 prior to installation of an opaque film;

DETAILED DESCRIPTION

Figure 3:
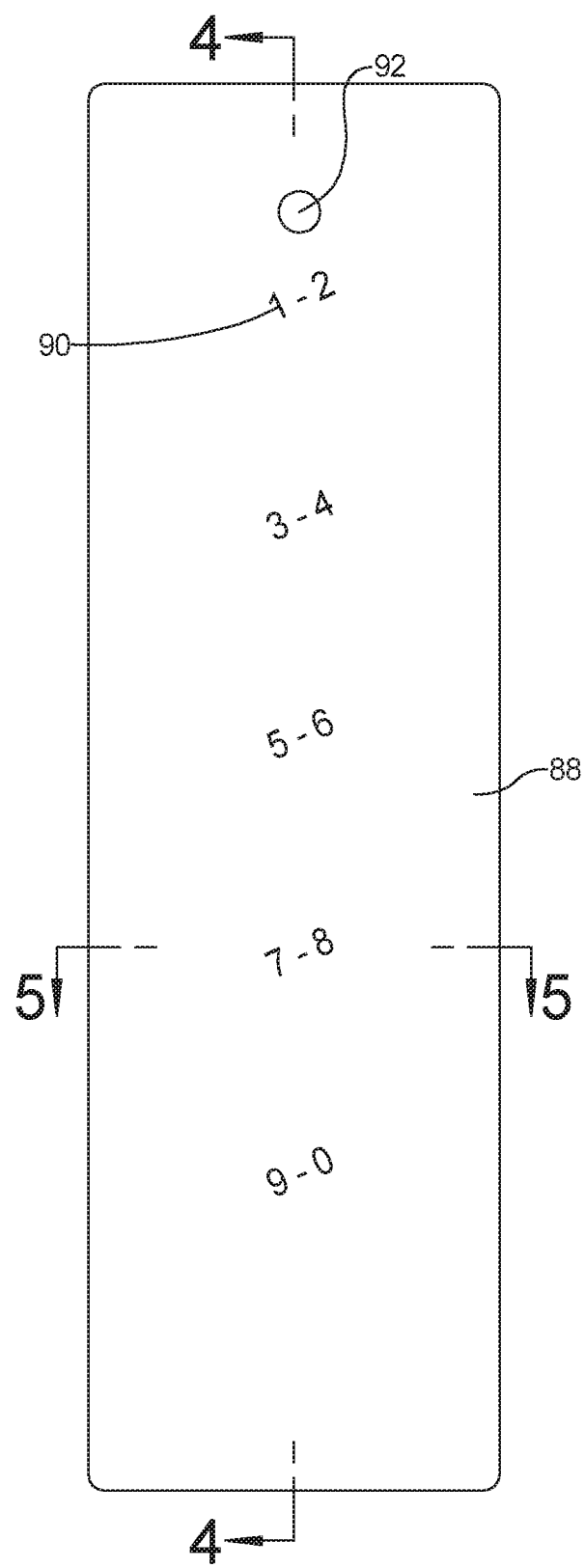
FIG. 3 is a bottom plan view of an opaque film for application onto the second face of the laminated printed circuit board with over-molded light guide of FIG. 2.

The following description is merely exemplary in nature and is not intended to limit the present disclosure, application, or uses.

Referring to FIG. 1, a laminated printed circuit board with over-molded light guide 10 includes a material printed circuit board 12, made for example from a fire retardant grande or high temperature resistant flex material such as poly-oxydiphenylene-pyromellitimide or metal material such as copper or a polycarbonate material. According to several aspects, the printed circuit board 12 defines a rectangular shape. On a first side or face 14 of the printed circuit board 12 are located multiple electronic components 16 including capacitors, which are electrically connected to a plurality of first electrical traces 18 printed for example by a screen printing process onto the first face 14. Multiple light emitting diodes 20, 22, 24, 26, 28 are individually mounted on the first face 14. An additional light emitting diode 30 can optionally be provided at one end of the printed circuit board 12 to provide an illuminated indication that electrical power is available for the laminated printed circuit board with over-molded light guide 10.

Figure 4:
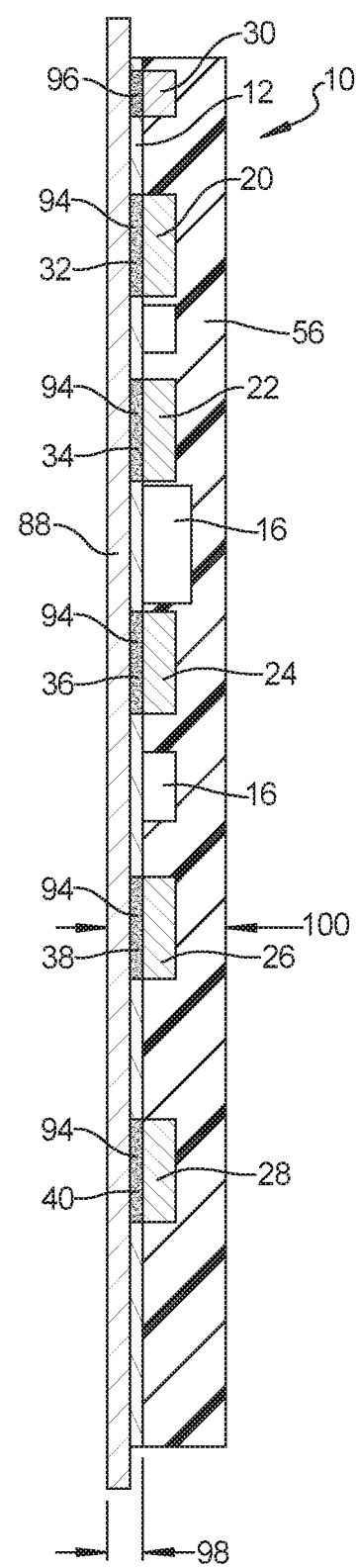
FIG. 4 is a cross sectional side elevational view taken at section 4 of FIG. 3.

Positioned proximate to each of the light emitting diodes 20, 22, 24, 26, 28 and extending through holes or bores created in the printed circuit board 12 are individual light guides 32, 34, 36, 38, 40 of a substantially transparent or light transmissive polymeric material such as poly-methyl methacrylate (PMMA). Each of the light guides 32, 34, 36, 38, 40 extends through a concomitantly shaped through bore 42, 44, 46, 48, 50 pre-formed in the printed circuit board 12. An additional light guide 52 is provided proximate to the optional light emitting diode 30 when provided, and is received in a through bore 54. Each of the light guides 32, 34, 36, 38, 40, 52 is integrally formed with a light transmissive polymeric material layer 56 of PMMA material applied over at least a portion of the first face 14 and the components mounted on the first face 14 as will be described in greater detail in reference to FIG. 4.

Also positioned on the first face 14 of the printed circuit board 12 prior to application of the layer 56 are a plurality of contact pads 58 which are connected to the electrical traces 18. Electrical power is provided to the laminated printed circuit board with over-molded light guide 10 by a wiring harness (not shown) connected to the contact pads 58. According to several aspects, a white or reflector film 60, only a portion of which is shown for clarity, is individually applied or ink printed over the layer 56, without contacting any portion of the first face 14 of the printed circuit board 12, or any other component mounted to the first face 14. The white or reflector film 60 is individually applied or ink printed onto a surface of the light transmissive polymeric material 56 which is directed away from the light guides 32, 34, 36, 38, 40, 52. The white or reflector film 60 enhances light reflection into the individual light guides 32, 34, 36, 38, 40, 52 for light generated by the light emitting diodes 20, 22, 24, 26, 28, 30.

Referring to FIG. 2 and again to FIG. 1, on an opposite second face 62 of the printed circuit board 12, and positioned proximate to individual ones of the through bores 42, 44, 46, 48, 50, 54 are printed multiple touch capacitive circuits 64, 66, 68, 70, 72 which are connected to touch capacitive second electrical traces 74. The second electrical traces 74 are connected by apertures or vias extending through the printed circuit board 12 to the contact pads 58 positioned on the first face 14 of the printed circuit board 12. A touch capacitive sensor 76, 78, 80, 82, 84 is also positioned proximate to individual ones of the touch capacitive circuits 64, 66, 68, 70, 72, which are connected by electrical traces 86 to the contact pads 58.

The light guides 32, 34, 36, 38, 40, 52 define window regions unobstructed by direct passage of the electrical traces or the electrical components and are maintained through the printed circuit board 12 proximate to each of the touch capacitive sensors 74, 76, 78, 80, 82. Each of the light guides 32, 34, 36, 38, 40, 52 or window regions permits light generated by one of the light emitting diodes 20, 22, 24, 26, 28 and reflected through one of the light guides 32, 34, 36, 38, 40, 52 to pass unobstructed through the printed circuit board 12 to locations of multiple indicia described in reference to FIG. 3. According to several aspects, an angular orientation of each of the touch capacitive circuits 64, 66, 68, 70, 72 matches an angular orientation of individual ones of the through bores 42, 44, 46, 48, 50, 54 such that the light guides 32, 34, 36, 38, 40, 52 directly align with the light emitting diodes 20, 22, 24, 26, 28, 30.

Referring to FIG. 3 and again to FIGS. 1 through 2, a polymeric substantially opaque film 88 is applied for example by adhesive bonding over the entire second face 62 including onto the touch capacitive circuits 64, 66, 68, 70, 72, the electrical traces 74, the touch capacitive sensors 74, 76, 78, 80, 82, and the electrical traces 86. The opaque film 88 extends over and therefore creates an end wall for each of the through bores 42, 44, 46, 48, 50 pre-formed in the printed circuit board 12 which is described in greater detail in reference to FIG. 4. According to several aspects, the opaque film 88 may contain a black ink rendering the opaque film 88 black in color. Light generated by any of the light emitting diodes 20, 22, 24, 26, 28, 30 of the printed circuit board 12 is blocked from passing through the opaque film 88 except at individual locations having an indicia 90. The indicia 90 are light transparent portions of the opaque film 88 rendered as successive number pairs, and are each individually aligned with one of the light guides 32, 34, 36, 38, 40, 52 where maximum light enhancement is achieved. A separate window region 92 can be provided through the opaque film 88 for light generated by the light emitting diode 30.

Referring to FIG. 4 and again to FIGS. 1 through 3, following application of each of the light emitting diodes 20, 22, 24, 26, 28, 30, the electrical components 16, and the first electrical traces 18 onto the first face 14 of the printed circuit board 12, and following application of the opaque film 88 onto the second face 62, the layer 56 of light transmissive polymeric material such as PMMA is applied over the entire first face 14 and over each of the components mounted on the first face 14. As previously noted, the opaque film 88 creates an end wall for each of the through bores 42, 44, 46, 48, 50. During the molding application of the layer 56 portions of the material of the layer 56 are also injection molded or flow into each of the through bores 42, 44, 46, 48, 50, 54 pre-formed in the printed circuit board 12. These portions of the material of the layer 56 individually contact the opaque film 88 defining the end wall of each of the through bores 42, 44, 46, 48, 50. These portions of the material of the layer 56 solidify to create the light guides 32, 34, 36, 38, 40, 52. The portions of the layer 56 creating each of the light guides 32, 34, 36, 38, 40, 52 extends entirely into the through bores 42, 44, 46, 48, 50, 54 to directly contact the opaque film 88.

Each of the light guides 32, 34, 36, 38, 40 includes an area of the light guide having a "pebbled", texturally modified area or geometry proximate to each of the light emitting diodes 20, 22, 24, 26, 28. These pebbled, texturally modified areas each define a light modifier which may be a reflector 94 or a light diffuser 95, which are features of the light guide itself created to locally enhance, reflect and scatter the light generated by the light emitting diodes 20, 22, 24, 26, 28. The light reflectors 94 or light diffuser 95 can be formed as positive or negative features formed in the mold. The texturally modified areas of light reflectors 94 or light diffusers 95 are generally aligned with each light guide, and may be formed to be entirely within an envelope of each light guide or formed to be larger than an envelope of each light guide. The light reflectors 94 or light diffusers 95 are each proximate to one of the light emitting diodes 20, 22, 24, 26, 28. Light diffuser 95 may be disposed at a distal end of the light guide 52 within the bore. A separate light reflector 96 may also be provided in the light guide 52 positioned proximate to the light emitting diode 30, which is similar to the light reflectors 94 in design and function. According to several aspects, each light reflector 94 or light diffuser 95 is aligned with one of the through bores 42, 44, 46, 48, 50 positioned proximate to the light reflector 94 or light diffuser 95. According to several aspects, a portion of each light emitting diode 20, 22, 24, 26, 28, 30 may be recessed into the printed circuit board 12 to improve the alignment of the light emitting diode 20, 22, 24, 26, 28, 30 with the proximate one of the light guides 32, 34, 36, 38, 40, 52.

When completed the printed circuit board 12 and the opaque film 88 of the laminated printed circuit board with over-molded light guide 10 together have a thickness 98 of approximately 0.5 mm or less. A total thickness 100 of the laminated printed circuit board with over-molded light guide 10 including the printed circuit board 12 and the opaque film 88 at the locations of each of the light emitting diodes 20, 22, 24, 26, 28 is approximately 1.0 mm or less. These thicknesses provide for maximum flexibility to allow conforming the laminated printed circuit board with over-molded light guide 10 to a curved geometry, for example to match the geometry of a trim component used in a motor vehicle "B" pillar.

Figure 5:
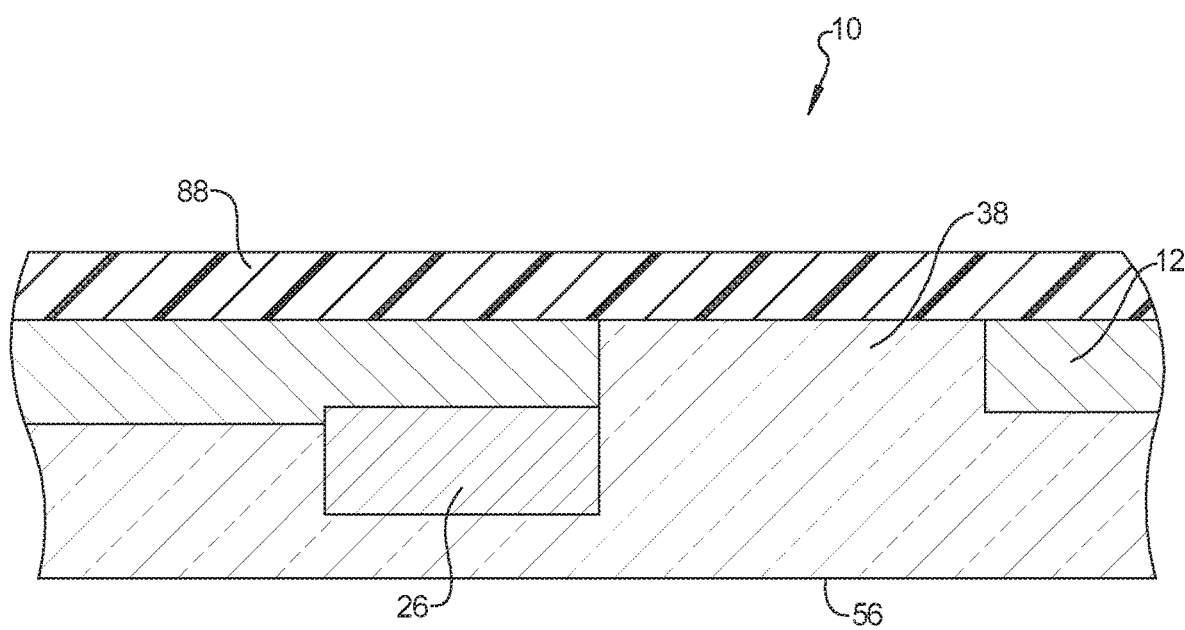
FIG. 5 is a cross sectional end elevational view taken at section 5 of FIG. 3.

Referring to FIG. 5 and again to FIGS. 1 through 4, each of the light guides 32, 34, 36, 38, 40, 52 such as the light guide 38 shown are made of the same polymeric material such as PMMA as the light transmissive polymeric material of the layer 56. The light guides are integrally and homogeneously connected to the layer 56 and according to several aspects are formed during the same injection molding step providing the layer 56.

Figure 6:
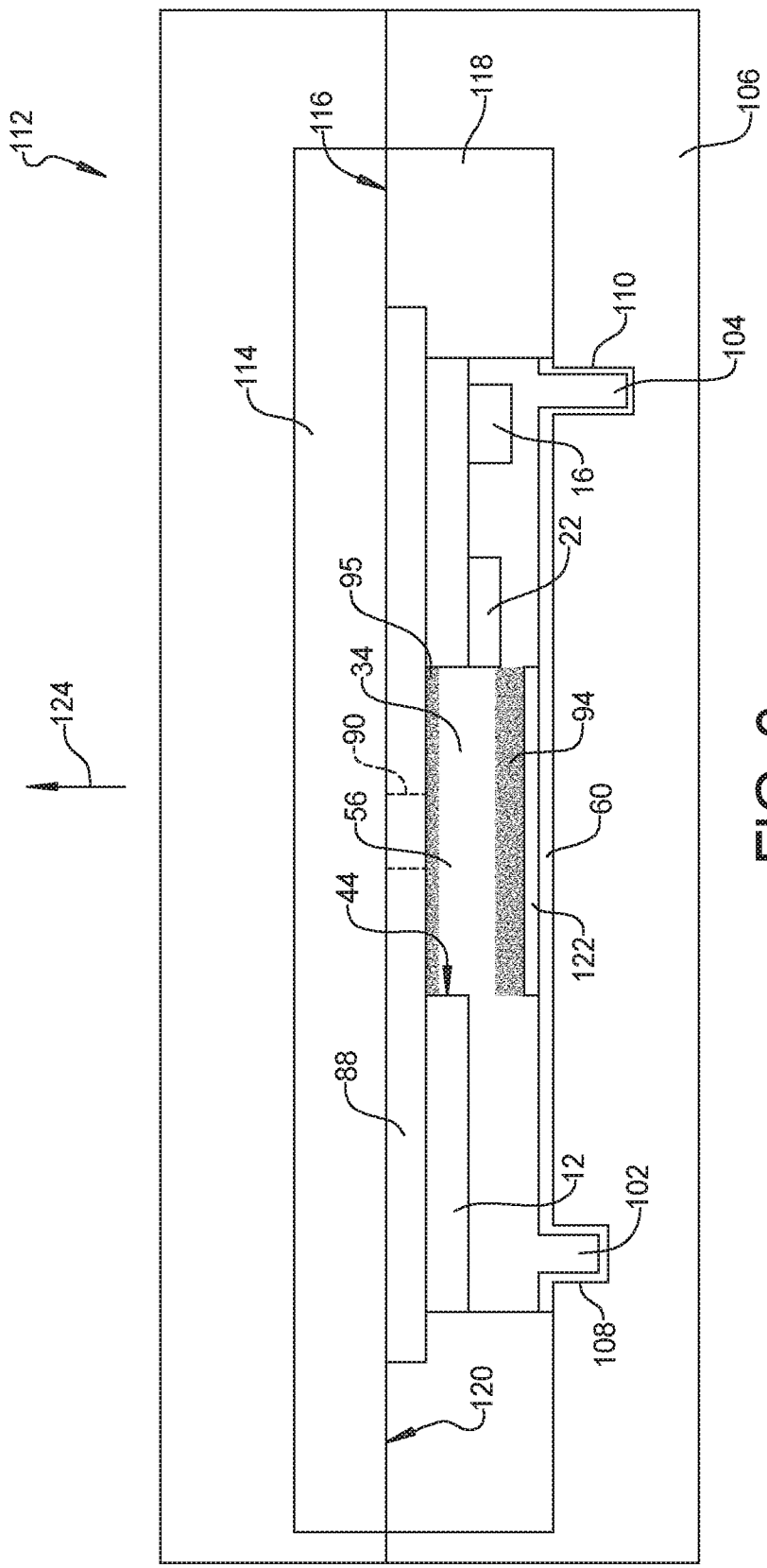
FIG. 6 is a cross sectional end elevational view taken at section 5 of FIG. 1.

Referring to FIG. 6 and again to FIGS. 1 through 5, an exemplary portion of the material of the layer 56 is shown substantially filling the through bore 44. As an alternative to the light reflector 94, a pebbled, texturally modified area provides a light modifier defining the light diffuser 95 which forms an end portion of the layer 56 abutting an end wall of the through bore 44 defined by the opaque film 88 extending over the through bore 44. Similar to the light reflector 94, the light diffuser 95 is the same material as the light transmissive material of the layer 56. As also evident, a material of a layer 56 can be extended outwardly and directed oppositely with respect to the opaque film 88 to form multiple location pins, including a first location pin 102 and a second location pin 104. The location pins assist in fixing the laminated printed circuit board with over-molded light guide 10 into portions of a mold 106, such as for example having the first location pin 102 being slidably received in a first slot 108 of the mold 106 and the second location pin 104 being slidably received in a second slot 110 of the mold 106.

A completed assembly 112 is created by first positioning the laminated printed circuit board with over-molded light guide 10 into the mold 106 using the location pins 102, 104 for alignment. A layer 114 of the same light transmissive polymeric material such as PMMA or a similar light transmissive material is injected onto the opaque film 88 and extends past the opaque film 88 defining a surface 120 which is substantially co-planar with an outside face of the opaque film 88. A polymeric material such as acrylonitrile butadiene styrene (ABS) is injected into the mold 106 to create a non-light transparent or opaque layer 118 about a perimeter of the printed circuit board 12 and the opaque film 88, and defines a surface 120 abutting the surface 116 of the layer 114 extending past the opaque film 88.

In the completed assembly 112, a light reflector lens 122 may be positioned within the layer 56 proximate to each texturally modified area defining one of the light reflectors 94 to more advantageously reflect light generated by the light emitting diodes such as the light emitting diode 22 into the light guides such as the light guide 34 shown. Free ends of the location pins 102, 104 can be removed after releasing the completed assembly 112 from the mold 106. A path for light generated by the light emitting diodes 20, 22, 24, 26, 28, 30, such as from the light emitting diode 22 shown, includes light reflection by the light reflector 94 into the light guides such as the light guide 34 shown, through the indicia, such as the indicia 90 of the opaque film 88 thereby back-lighting the indicia 90, through the light transmissive layer 56, and outward from the laminated printed circuit board with over-molded light guide 10 in a direction 124.

A laminated printed circuit board with over-molded light guide 10 of the present disclosure offers several advantages. These include formation of light guides integrally connected to a polymeric material layer 56 when the polymeric layer 56 is applied over a portion or an entire first face 14 of a printed circuit board 12. The layer 56 therefore protects components connected to the printed circuit board 12 while also providing light guides in pre-formed bores of the printed circuit board 12. The positioning of the pre-formed bores in the printed circuit board 12 also ensures proximity placement of the light guides to each of the light emitting diodes on the printed circuit board 12.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A laminated printed circuit board with over-molded light guide, comprising:
   a printed circuit board having electronic components mounted on a first face of the printed circuit board, and a bore extending through the printed circuit board;
   a light emitting diode mounted on the first face proximate to the bore; and
   a light transmissive polymeric material applied onto each of the electronic components, the light emitting diode and a portion of the first face of the printed circuit board, a portion of the polymeric material extending into the bore to create a light guide proximate to the light emitting diode.

2. The laminated printed circuit board with over-molded light guide of claim 1, wherein the light guide includes a texturally modified area defining a light modifier.

3. The laminated printed circuit board with over-molded light guide of claim 2, wherein the light modifier is a reflector positioned proximate to the light emitting diode.

4. The laminated printed circuit board with over-molded light guide of claim 2, wherein the light reflector is aligned with an axis of the bore.

5. The laminated printed circuit board with over-molded light guide of claim 2, wherein the light modifier is a diffuser formed at the end of the light guide within the bore.

6. The laminated printed circuit board with over-molded light guide of claim 1, further including an opaque film applied over a second face of the printed circuit board.

7. The laminated printed circuit board with over-molded light guide of claim 6, wherein the opaque film defines an end wall of the bore contacted by the portion of the polymeric material extending into the bore.

8. The laminated printed circuit board with over-molded light guide of claim 6, wherein light generated by the light emitting diode is blocked from passing through the opaque film except at a location of an indicia, the indicia defining light transparent portions of the opaque film.

9. The laminated printed circuit board with over-molded light guide of claim 6, further including:
   an opaque layer disposed about a perimeter of the printed circuit board and the opaque film; and
   an acrylic layer disposed over an outer surface of the opaque film positioned opposite the surface applied over the first face of the printed circuit board, and the acrylic layer disposed over a portion of the opaque layer.

10. The laminated printed circuit board with over-molded light guide of claim 1, further including a touch capacitive circuit printed onto a second face of the printed circuit board.

11. The laminated printed circuit board with over-molded light guide of claim 1, further including a reflector film individually applied or ink printed over the light transmissive polymeric material.

12. A laminated printed circuit board with over-molded light guide, comprising:
   a printed circuit board having electronic components mounted on a first face of the printed circuit board, and a bore extending through the printed circuit board;
   a light emitting diode mounted on the first face proximate to the bore;
   an opaque film fixed onto a second face of the printed circuit board, the opaque film creating an end wall of the bore; and
   a light transmissive polymeric material applied over each of the electronic components, the light emitting diode and a portion of the first face of the printed circuit board, a portion of the polymeric material extending into the bore and contacting the opaque film defining the end wall of the bore to create a light guide for transmitting light from the light emitting diode through the bore.

13. The laminated printed circuit board with over-molded light guide of claim 12, further including:
   a touch capacitive circuit printed onto the second face of the printed circuit board and positioned between the opaque film and the second face; and
   a touch capacitive sensor connected to the second face of the printed circuit board and positioned between the opaque film and the second face.

14. The laminated printed circuit board with over-molded light guide of claim 12, further including a white film individually applied or ink printed onto a surface of the light transmissive polymeric material directed away from the light guide.

15. The laminated printed circuit board with over-molded light guide of claim 12, further including an opaque layer positioned about a perimeter of the printed circuit board and the opaque film.

16. The laminated printed circuit board with over-molded light guide of claim 12, further including an acrylic layer disposed over an outer surface of the opaque film positioned opposite the surface applied over the first face of the printed circuit board, and the acrylic layer disposed over a portion of the opaque layer.

17. The laminated printed circuit board with over-molded light guide of claim 12, wherein the light guide includes a texturally modified area defining a light modifier, and wherein the light modifier is aligned with an axis of the bore.

18. The laminated printed circuit board with over-molded light guide of claim 17, wherein the light modifier is a diffuser formed at an end of the light guide within the bore.

19. A laminated printed circuit board with over-molded light guide, comprising:
- a printed circuit board of a metal material having electronic components mounted on a first face of the printed circuit board connected to first electrical traces printed on the first face, and a bore extending through the printed circuit board;
- a light emitting diode mounted on the first face proximate to the bore and connected to the first electrical traces;
- a light transmissive polymeric material overmolded onto the electronic components, the light emitting diode and at least a portion of the first face of the printed circuit board, a portion of the light transmissive polymeric material extending into the bore and contacting an opaque film having a translucent portion therein, the opaque film defining an end wall of the bore to create a light guide for transmitting light from the emitting diode through the bore and to the translucent portion of the opaque film; and
- a polymeric material opaque layer positioned about a perimeter of the printed circuit board and a perimeter of the opaque film, and applied onto a surface of the light transmissive polymeric material extending freely beyond the opaque film.

20. The laminated printed circuit board with over-molded light guide of claim 19, further including:
- a touch capacitive circuit and a touch capacitive sensor mounted on a second face of the printed circuit board; and
- the opaque film is further applied over the second face of the printed circuit board including over the touch capacitive circuit and the touch capacitive sensor.

21. The laminated printed circuit board with over-molded light guide of claim 20, wherein:
- the opaque film creates an end wall of the bore contacted by the light transmissive polymeric material extending into the bore; and
- a face of the opaque layer is substantially co-planar with a face of the opaque film.

* * * * *